(12) United States Patent
Ma et al.

(10) Patent No.: US 6,271,469 B1
(45) Date of Patent: Aug. 7, 2001

(54) DIRECT BUILD-UP LAYER ON AN ENCAPSULATED DIE PACKAGE

(75) Inventors: Qing Ma, San Jose; Chun Mu, Saratoga; Harry Fujimoto, Sunnyvale, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/438,221

(22) Filed: Nov. 12, 1999

(51) Int. Cl.⁷ .................................................... H01L 23/02
(52) U.S. Cl. ................................................................ 174/52.4
(58) Field of Search .................... 174/52.1, 52.2, 174/52.3, 52.4; 361/813; 257/676, 693, 738, 778, 787, 788, 789; 29/832, 840

(56) References Cited

U.S. PATENT DOCUMENTS

| | | | |
|---|---|---|---|
| 3,740,920 | * 6/1973 | Lane ........................................ 156/60 |
| 4,705,917 | * 11/1987 | Gates, Jr. et al. .................. 174/52.4 |
| 4,925,024 | * 5/1990 | Ellenberger et al. ............... 174/52.4 |
| 5,353,498 | 10/1994 | Fillion et al. . |
| 5,414,214 | * 5/1995 | Cho et al. ........................... 174/52.3 |
| 5,422,513 | 6/1995 | Marcinkiewicz et al. . |
| 5,497,033 | 3/1996 | Fillion et al. . |
| 5,527,741 | 6/1996 | Cole et al. . |
| 5,703,400 | 12/1997 | Wojnarowski et al. . |
| 5,745,984 | 5/1998 | Cole, Jr. et al. . |
| 5,790,378 | * 8/1998 | Chillara ................................ 361/719 |
| 5,894,107 | * 4/1999 | Lee et al. ............................ 174/52.2 |
| 6,154,366 | * 11/2000 | Ma et al. ............................. 361/704 |
| 6,192,578 | * 2/2001 | Manning et al. ...................... 29/840 |

FOREIGN PATENT DOCUMENTS

| | | |
|---|---|---|
| 11045955 | 2/1999 | (JP) . |
| 11312868 | 11/1999 | (JP) . |

* cited by examiner

*Primary Examiner*—Adolf Deneke Berhane
(74) *Attorney, Agent, or Firm*—Robert G. Winkle

(57) ABSTRACT

A microelectronic package including a microelectronic die having an active surface and at least one side. An encapsulation material is disposed adjacent the microelectronic die side(s), wherein the encapsulation material includes at least one surface substantially planar to the microelectronic die active surface. A first dielectric material layer may be disposed on at least a portion of the microelectronic die active surface and the encapsulation material surface. At least one conductive trace is then disposed on the first dielectric material layer. The conductive trace(s) is in electrical contact with the microelectronic die active surface. At least one conductive trace extends vertically adjacent the microelectronic die active surface and vertically adjacent the encapsulation material surface.

21 Claims, 45 Drawing Sheets

DIRECT BUILD-UP LAYER ON AN ENCAPSULATED DIE PACKAGE

BACKGROUND OF THE INVENTION

1. Field of the Invention:

The present invention relates to apparatus and processes for packaging microelectronic dice. In particular, the present invention relates to a packaging technology that fabricates build-up layers on an encapsulated microelectronic die and on the encapsulation material which covers the microelectronic die.

2. State of the Art:

Higher performance, lower cost, increased miniaturization of integrated circuit components, and greater packaging density of integrated circuits are ongoing goals of the computer industry. As these goals are achieved, microelectronic dice become smaller. Of course, the goal of greater packaging density requires that the entire microelectronic die package be equal to or only slightly larger (about 10% to 30%) than the size of the microelectronic die itself. Such microelectronic die packaging is called a "chip scale packaging" or "CSP".

As shown in FIG. 8, true CSP would involve fabricating build-up layers directly on an active surface 204 of a microelectronic die 202. The build-up layers may include a dielectric layer 206 disposed on the microelectronic die active surface 204. Conductive traces 208 may be formed on the dielectric layer 206, wherein a portion of each conductive trace 208 contacts at least one contact 212 on the microelectronic die active surface 204. External contacts, such as solder balls or conductive pins for contact with an external component (not shown), may be fabricated to electrically contact at least one conductive trace 208. FIG. 8 illustrates the external contacts as solder balls 214 where are surrounded by a solder mask material 216 on the dielectric layer 206. However in such true CSP, the surface area provided by the microelectronic die active surface 204 generally does not provide enough surface for all of the external contacts needed to contact the external component (not shown).

Additional surface area can be provided through the use of an interposer, such a substrate (substantially rigid material) or a flex component (substantially flexible material). FIG. 9 illustrates a substrate interposer 222 having a microelectronic die 224 attached to and in electrical contact with a first surface 226 of the substrate interposer 222 through small solder balls 228. The small solder balls 228 extend between contacts 232 on the microelectronic die 224 and conductive traces 234 on the substrate interposer first surface 226. The conductive traces 234 are in discrete electrical contact with bond pads 236 on a second surface 238 of the substrate interposer 222 through vias 242 that extend through the substrate interposer 222. External contacts are formed on the bond pads 236 (shown as solder balls 244).

The use of the substrate interposer 222 requires number of processing steps. These processing steps increase the cost of the package. Additionally, even the use of the small solder balls 228 presents crowding problems which can result in shorting between the small solder balls 228 and can present difficulties in inserting underfilling between the microelectronic die 224 and the substrate interposer 222 to prevent contamination.

FIG. 10 illustrates a flex component interposer 252 wherein an active surface 254 of a microelectronic die 256 is attached to a first surface 258 of the flex component interposer 252 with a layer of adhesive 262. The microelectronic die 256 is encapsulated in an encapsulation material 264. Openings are formed in the flex component interposer 252 by laser abalation through the flex component interposer 252 to contacts 266 on the microelectronic die active surface 254 and to selected metal pads 268 residing within the flex component interposer 252. A conductive material layer is formed over a second surface 272 of the flex component interposer 252 and in the openings. The conductive material layer is patterned with standard photomask/etch processes to form conductive vias 274 and conductive traces 276. External contacts are formed on the conductive traces 276 (shown as solder balls 278 surrounded by a solder mask material 282 proximate the conductive traces 276).

The use of a flex component interposer 252 requires gluing material layers which form the flex component interposer 252 and requires gluing the flex component interposer 252 to the microelectronic die 256. These gluing processes are relatively difficult and increase the cost of the package.

Therefore, it would be advantageous to develop new apparatus and techniques to provide additional surface area to form traces for use in CSP applications, while utilizing commercially available, widely practiced semiconductor fabrication techniques.

SUMMARY OF THE INVENTION

The present invention relates to a packaging technology that fabricates build-up layers on an encapsulated microelectronic die and on the encapsulation material that covers the microelectronic die. An exemplary microelectronic package includes a microelectronic die having an active surface and at least one side. An encapsulation material is disposed adjacent the microelectronic die side(s), wherein the encapsulation material includes at least one surface substantially planar to the microelectronic die active surface. A first dielectric material layer may be disposed on at least a portion of the microelectronic die active surface and the encapsulation material surface. At least one conductive trace is then disposed on the first dielectric material layer. The conductive trace(s) is in electrical contact with the microelectronic die active surface. At least one conductive trace extends vertically adjacent the microelectronic die active surface and vertically adjacent the encapsulation material surface.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Although FIGS. 1a–1k, 2a–2d, 3a–3f, 4a–4e, 5a–5f, 6a–6e, and 7a–7e illustrate various views of the present invention, these figures are not meant to portray microelectronic assemblies in precise detail. Rather, these figures illustrate semiconductor assemblies in a manner to more clearly convey the concepts of the present invention. Additionally, elements common between the figures retain the same numeric designation.

Figure 1A:
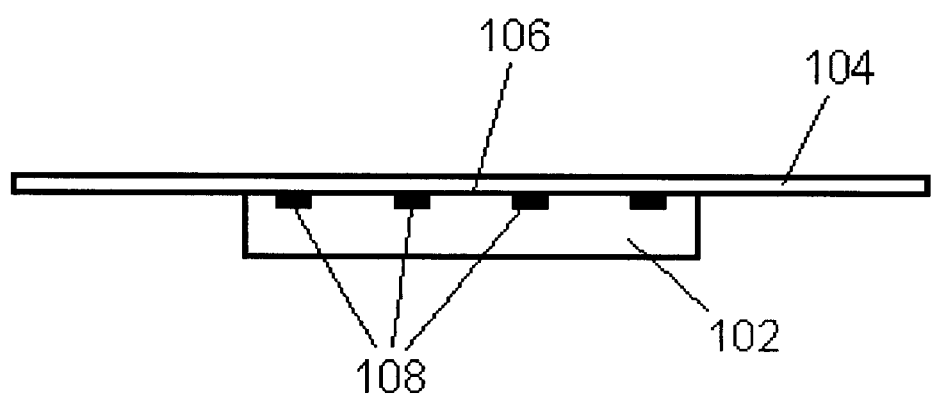
FIGS. 1a–1k are side cross-sectional views of a first embodiment of a process of forming a microelectronic package, according to the present invention.

The present invention includes a packaging technology that fabricates build-up layers on an encapsulated microelectronic die that has expanded area larger than that of the microelectronic die. FIGS. 1a–1k illustrate a first embodiment of a process of forming a microelectronic package of the present invention. As shown in FIG. 1a, a protective film 104 is abutted against an active surface 106 of a microelectronic die 102 to protect the microelectronic die active surface 106 from any contaminants. The microelectronic die active surface 106 has at least one contact 108 disposed thereon. The contacts 108 are in electrical contact with integrated circuitry (not shown) within the microelectronic die 102. The protective film 104 may have a weak adhesive, similar to protective films used in the industry during wafer dicing, which attaches to the microelectronic die active surface 106. This adhesive-type film may be applied prior to placing the microelectronic die 102 in a mold used for the encapsulation process. The protective film 104 may also be a non-adhesive film, such as a ETFE (ethylene-tetrafluoroethylene) or Teflon® film, which is held on the microelectronic die active surface 106 by an inner surface of the mold during the encapsulation process.

Figure 1B:
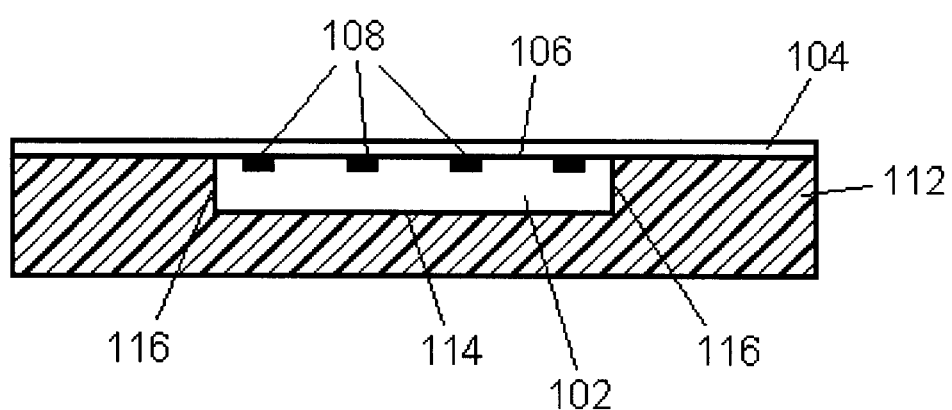

The microelectronic die 102 is then encapsulated with an encapsulating material 112, such as plastics, resins, and the like, as shown in FIG. 1b, that covers a back surface 114 and side(s) 116 of the microelectronic die 102. The encapsulation of the microelectronic die 102 may be achieved by any known process, including but not limited to injection, transfer, and compression molding. The encapsulation material 112 provides mechanical rigidity, protects the microelectronic die 102 from contaminants, and provides surface area for the build-up of trace layers.

Figure 1C:
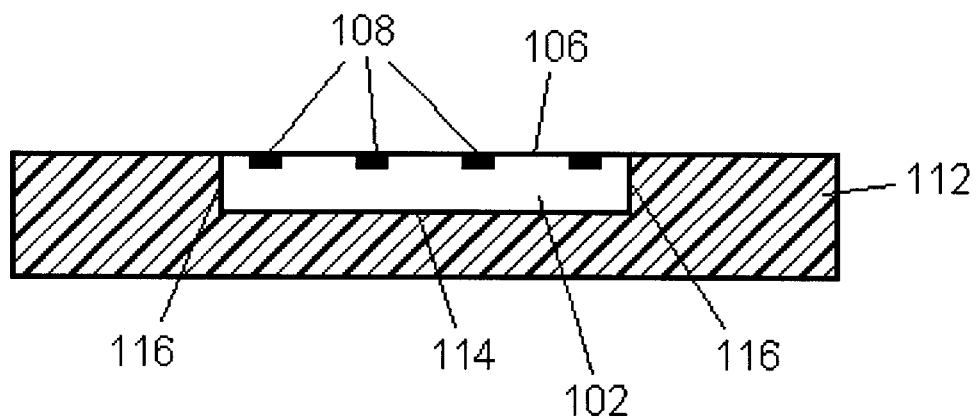

After encapsulation, the protective film 104 is removed, as shown in FIG. 1c, to expose the microelectronic die active surface 106. As also shown in FIG. 1c, the encapsulation material 112 is molded to form at least on surface 110 which is substantially planar to the microelectronic die active 106. The encapsulation material surface 110 will be utilized in further fabrication steps as additional surface area for the formation of build-up layers, such as dielectric material layers and conductive traces.

Figure 1D:
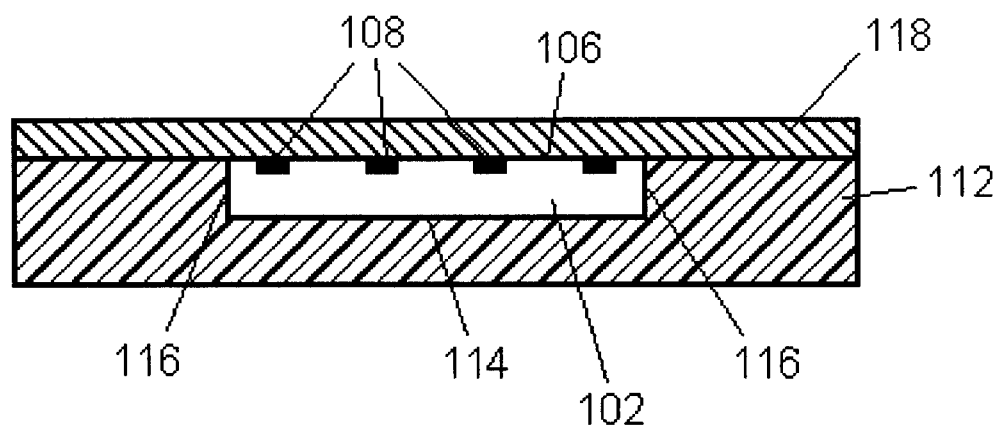

A first dielectric layer 118, such as silicon dioxide, silicon nitride, and the like, is disposed over the microelectronic die active surface 106, the contacts 108, and the encapsulant material surface 110, as shown in FIG. 1d. The formation of the first dielectric layer 118 may be achieved by any known process, including but not limited to spin and spray-on deposition.

Figure 1E:
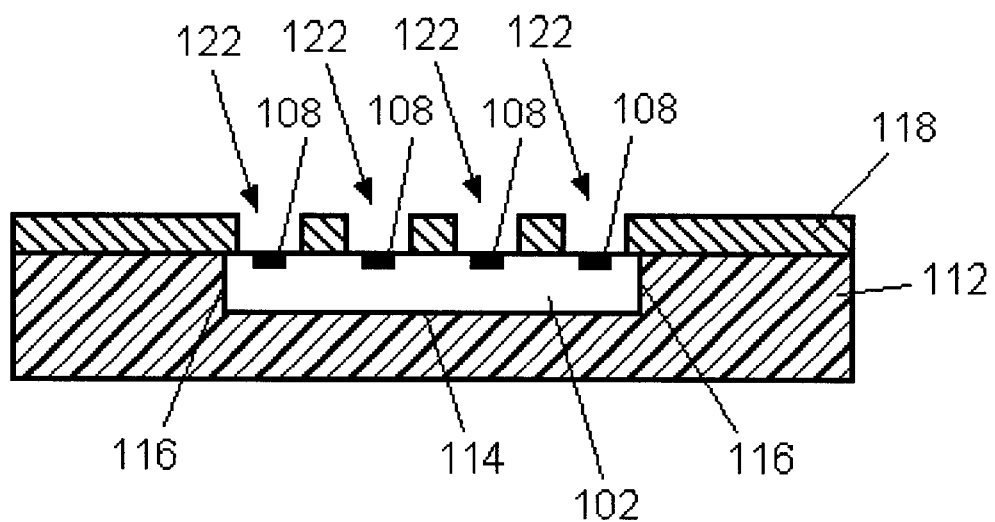

As shown in FIG. 1e, a plurality of vias 122 are then formed through the first dielectric layer 118. The plurality of vias 122 may be formed any method known in the art, including but not limited to laser drilling, photolithography, and, if the first dielectric layer 118 is photoactive, forming the plurality of vias 122 in the same manner that a photoresist mask is made in a photolithographic process, as known in the art.

Figure 1F:
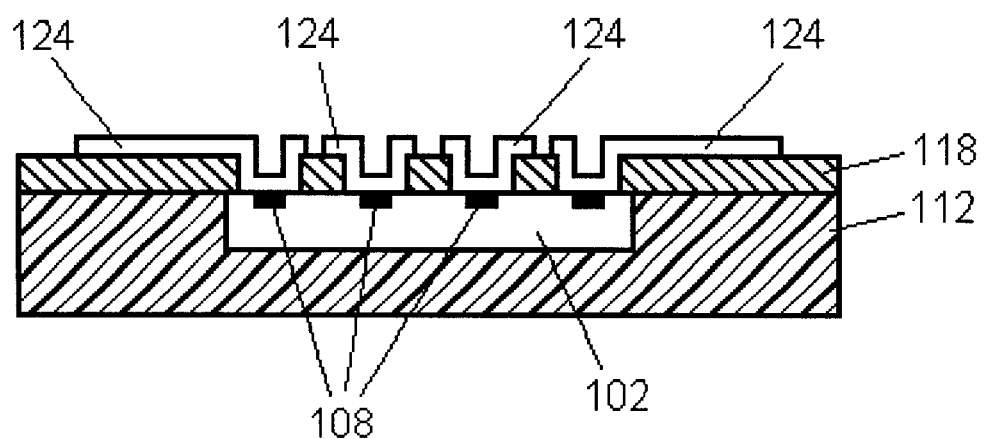

A plurality of conductive traces 124 is formed on the first dielectric layer 118, as shown in FIG. 1f, wherein a portion of each of the plurality of conductive trace 124 extends into at least one of said plurality of vias 122 to make electrical contact therewith. The plurality of conductive traces 124 may be made of any applicable conductive material, such as copper, aluminum, and alloys thereof. As shown in FIG. 1f, at least one conductive trace extends vertically adjacent the microelectronic die active surface 106 and vertically adjacent said encapsulation material surface 110.

The plurality of conductive traces 124 formed by any known technique, including by not limited to photolithographic techniques. An exemplary photolithographic technique can involve forming a conformal layer of conductive material over the dielectric layer and applying a thin photoresist coating (hereinafter "photoresist") over the conductive material layer. The photoresist is photoactive, such that when exposed to light (usually ultraviolet light), the photoresist either becomes soluble (positive photoresist) or insoluble (negative photoresist) in specific solvents. Light is projected through a template that shields specific areas of the photoresist while exposing other areas, thereby translating the pattern of the template onto the photoresist. After exposure, the desired portions of the photoresist are removed by an appropriate solvent. The remaining photoresist becomes a mask that remains on the conductive material layer. The mask is used to expose areas of the conductive material layer to be etched, thereby forming the conductive traces.

Figure 1G:
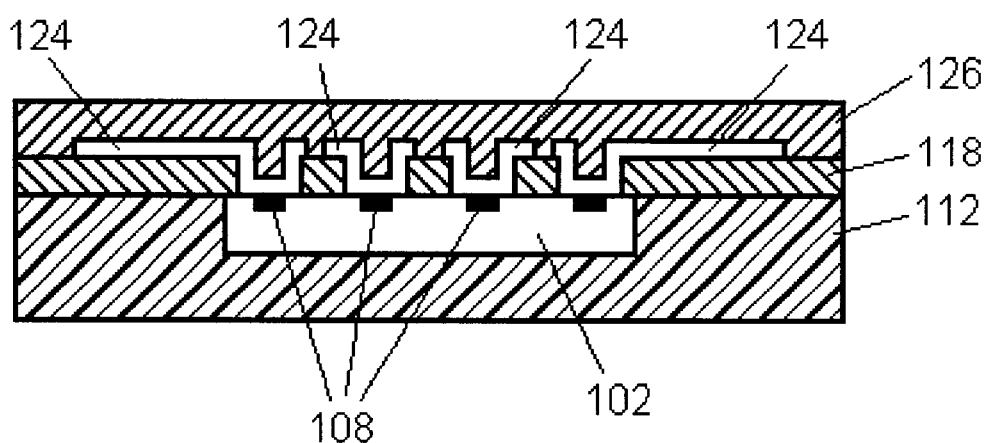

As shown in FIG. 1g, a second dielectric layer 126 is disposed over the plurality of conductive traces 124 and the first dielectric layer 118. The formation second dielectric layer 126 may be achieved by any known process, including but not limited to spin and spray-on deposition.

Figure 1H:
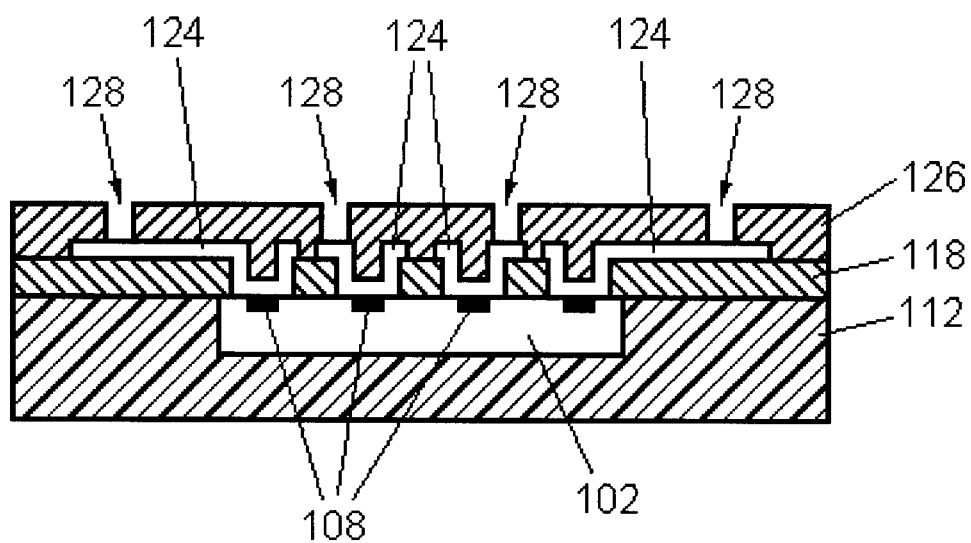

As shown in FIG. 1h, a plurality of second vias 128 are then formed through the second dielectric layer 126. The plurality of second vias 128 may be formed any method known in the art, including but not limited to laser drilling and, if the second dielectric layer 126 is photoactive, forming the plurality of second vias 128 in the same manner that a photoresist mask is made in a photolithographic process, as known in the art.

Figure 1I:
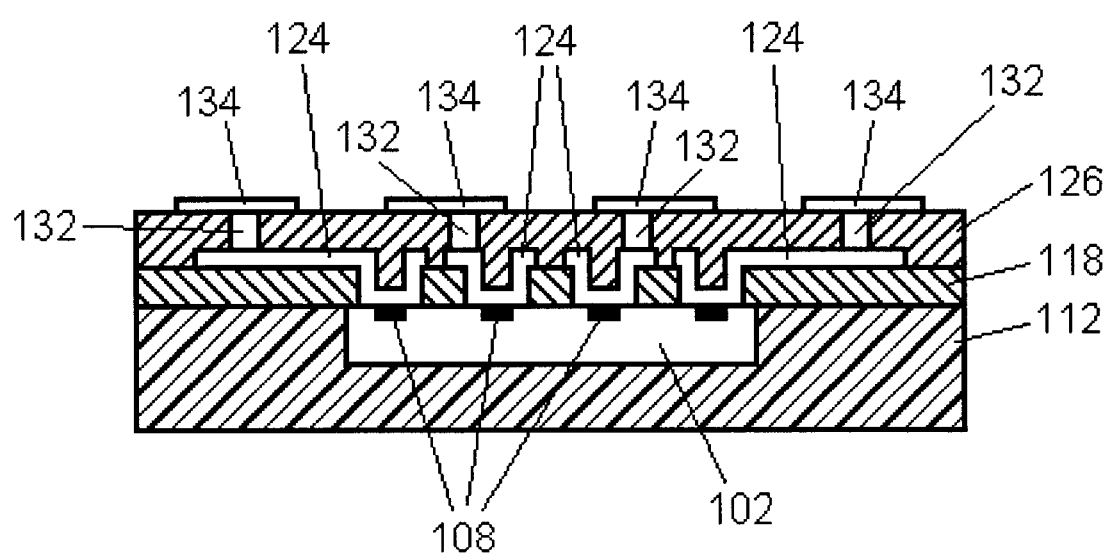
Figure 1J:
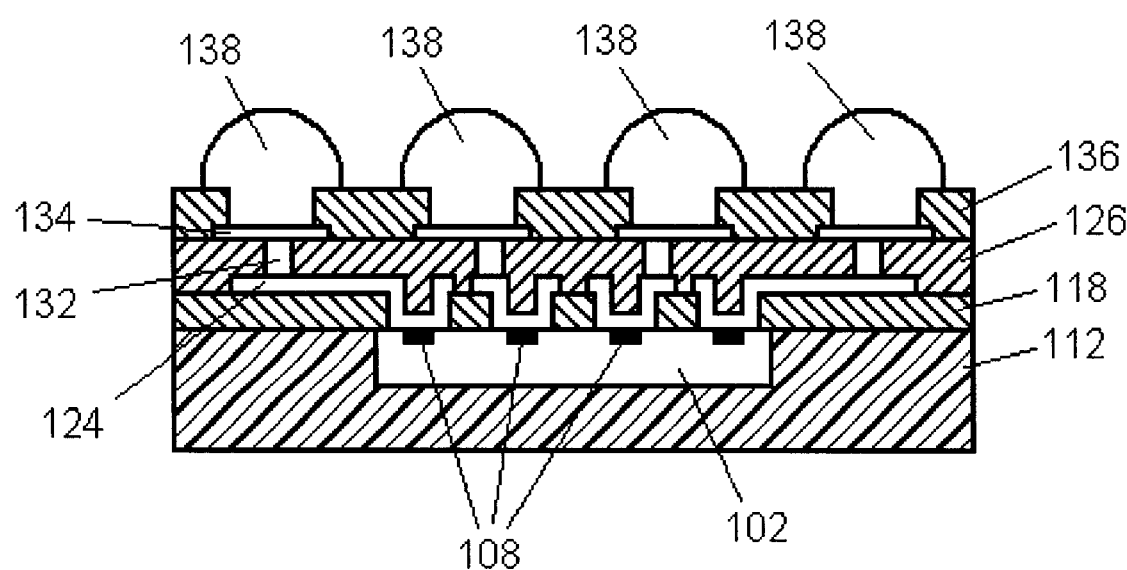
Figure 1K:
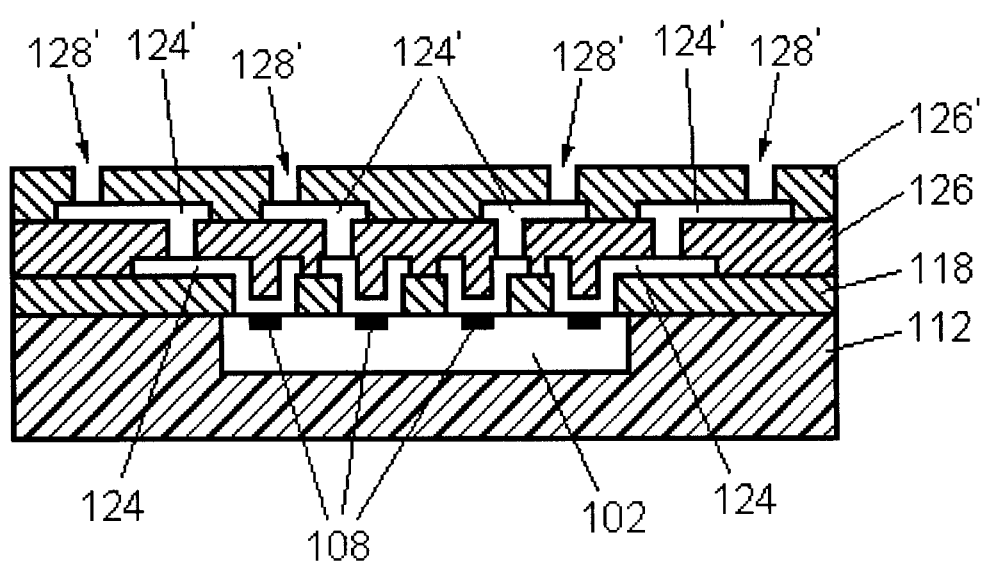

If the plurality of conductive traces 124 is not capable of placing the plurality of second vias 128 in an appropriate position, then other portions of the conductive traces are formed in the plurality of second vias 128 and on the second dielectric layer 126, another dielectric layer formed thereon, and another plurality of vias is formed in the dielectric layer, such as described in FIG. 1f–1h. The layering of dielectric layers and the formation of conductive traces can be repeated until the vias are in an appropriate position. Thus, portions of a single conductive trace be formed from multiple portions thereof and can reside on different dielectric layers. This concept is illustrated in FIG. 1k wherein the other portions of the conductive traces are referenced as 124', the additional dielectric layer is referenced as 126', and the additional plurality of vias is referenced as 128'.

Assuming that the plurality of second vias 128 is correctly positioned (as shown in FIG. 1h), a conductive material is disposed in the plurality of second vias 128, by any known technique, to form a plurality of conductive plugs 132. A plurality of conductive pads 134 is formed on the second dielectric layer 126, wherein each of the plurality of conductive pads 134 is in discrete contact with each of the plurality of conductive plugs 132, as shown in FIG. 1i.

Once the conductive pads 134 are formed, they can be used in the formation of conductive interconnects, such as solder bumps, solder balls, pins, and the like, for communication with external components. For example, a solder mask material 136 can be disposed over the second dielectric layer 126 and the plurality of conductive pads 134. A plurality of vias is then formed in the solder mask material 136 to expose at least a portion of each of the plurality of conductive pads 134. A plurality of conductive bumps 138, such as solder bumps, can be formed, such as by known plating techniques, on the exposed portion of each of the plurality of conductive pads 134, as shown in FIG 1j.

Figure 2A:
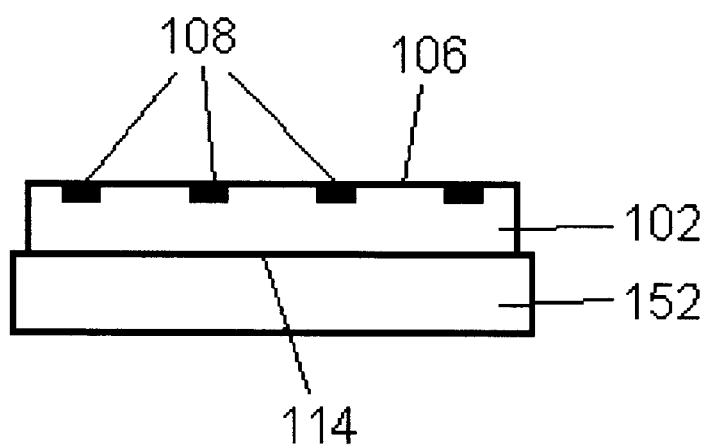
FIGS. 2a–2d are side cross-sectional views of another embodiment of a process of forming a microelectronic package that incorporates a heat dissipation device, according to the present invention.

FIGS. 2a–2d illustrate another embodiment of the present invention that incorporates a heat dissipation device. As shown in FIG. 2a, a thermally conductive, heat dissipation device, such as heat slug 152 is attached to the microelectronic die back surface 114, preferably with a thermally conductive adhesive (not shown). The heat slug 152 should have a CTE (coefficient of thermal expansion) close to that of the microelectronic die 102 to reduce thermal stresses. For example, for a microelectronic die 102 formed of a silicon material, thermally conductive materials such as molybdenum and aluminum/silicon/carbon alloys would closely match the CTE of the silicon material.

Figure 2B:
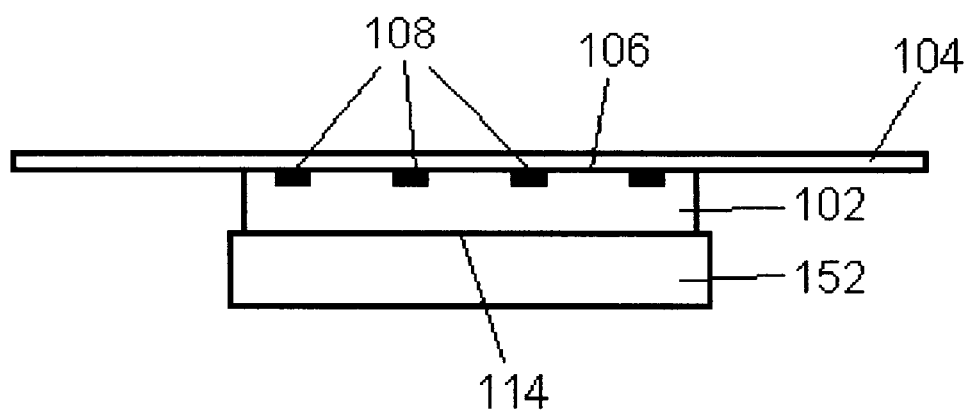
Figure 2C:
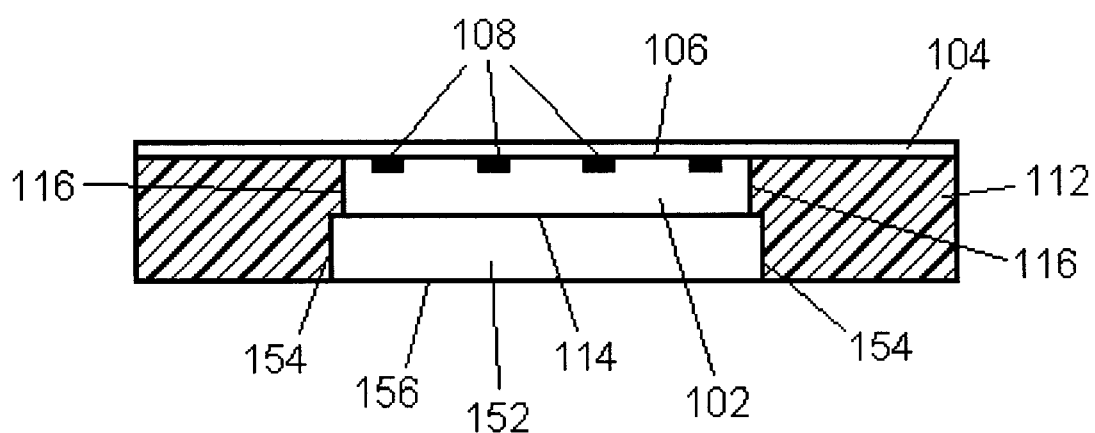
Figure 2D:
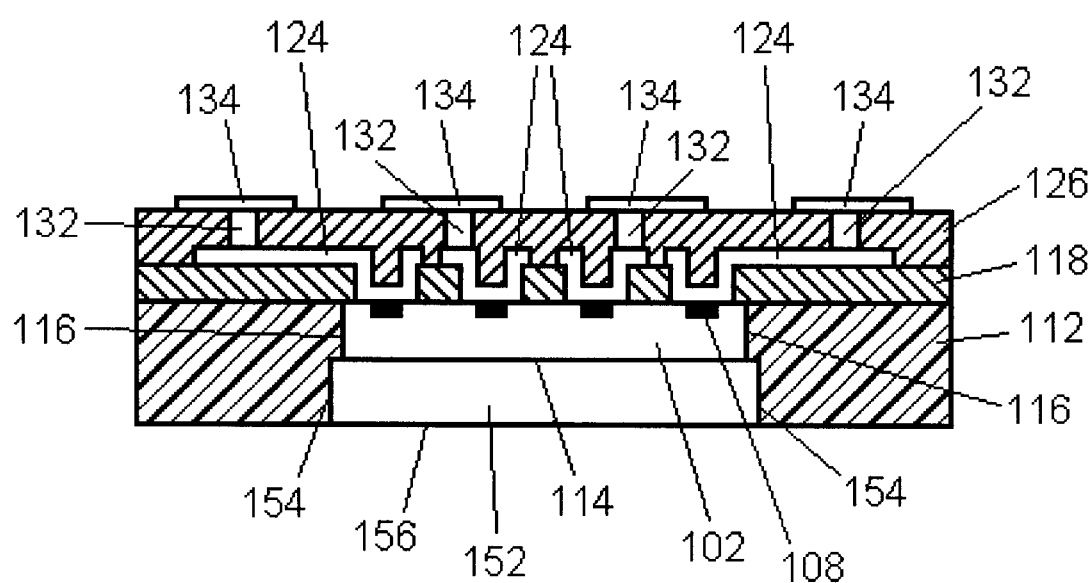

The protective film 104 is abutted against the microelectronic die active surface 106, as shown in FIG. 2b. The protective film 104 may be adhesive or non-adhesive as previously discussed. The microelectronic die 102 and the heat slug 152 are then encapsulated with an encapsulating material 112, as shown in FIG. 2c, that covers microelectronic die side(s) 116 and side(s) 154 of the heat slug 152. A back surface 156 of the heat slug 152 is preferably not cover with the encapsulating material 112 so that thermal energy drawn into the heat slug 152 from the microelectronic die 102 can be dissipated to the ambient environment from the heat slug back surface 156, or so that an addition heat dissipation device can be attached to the heat slug back surface 156. As illustrated in FIG. 2d, after encapsulation, the protective film 104 is removed and at least one dielectric layer (shown as a first dielectric layer 118 and a second dielectric layer 126), conductive traces 124, and conductive pads 134 are fabricated, such as described in FIGS. 1c–1i.

Figure 3A:
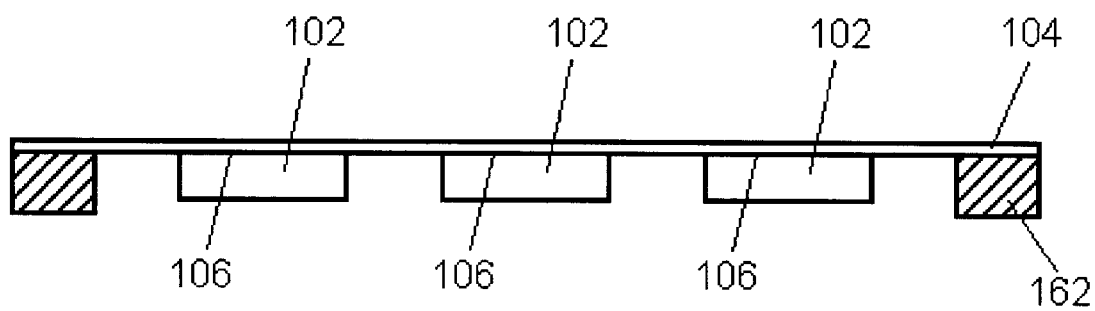
FIGS. 3a–3f are side cross-sectional views of a method for die alignment, attachment, and molding of a microelectronic package, according to the present invention.
Figure 3B:
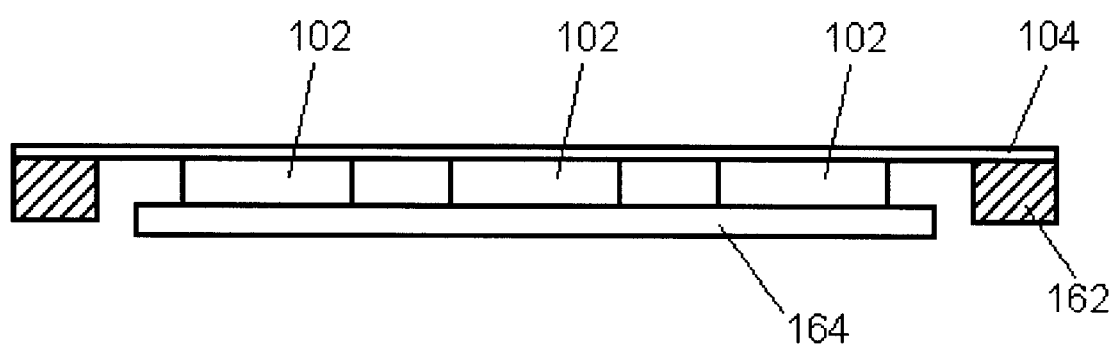
Figure 3C:
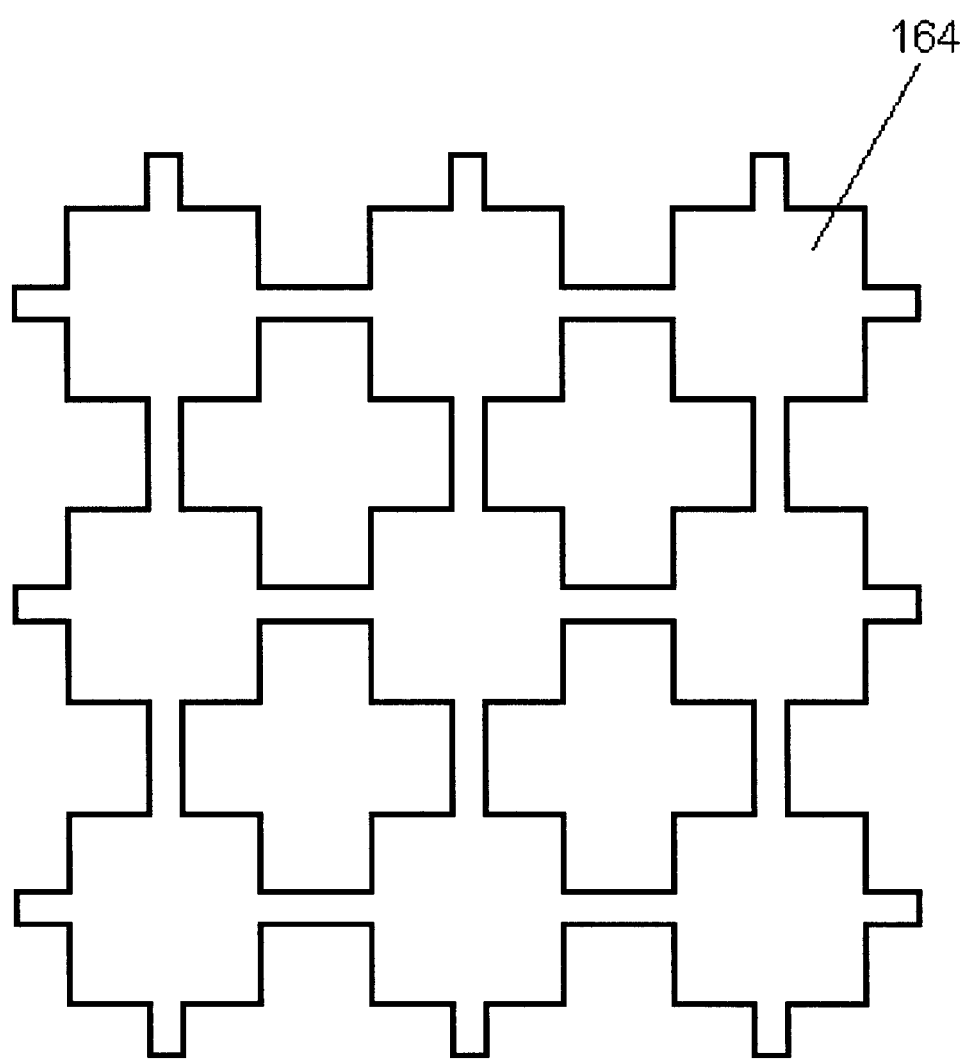
Figure 3D:
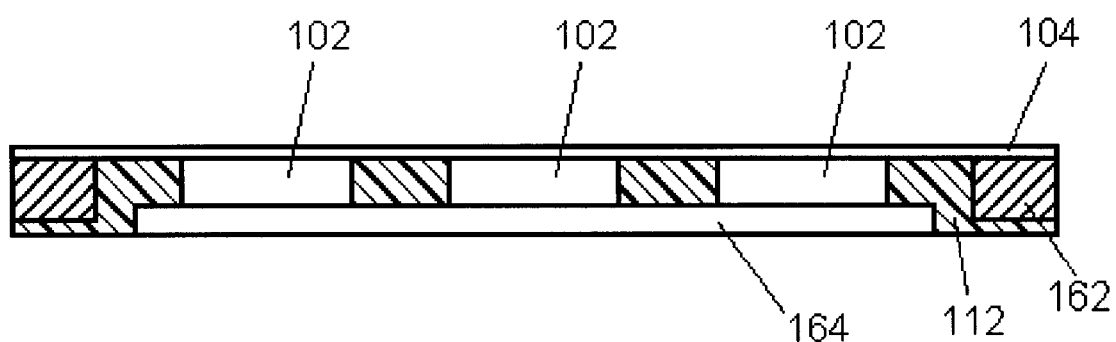
Figure 3E:
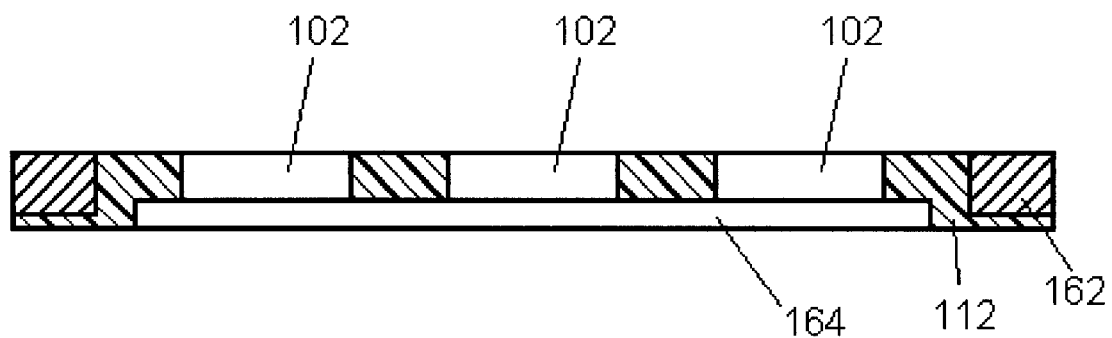
Figure 3F:
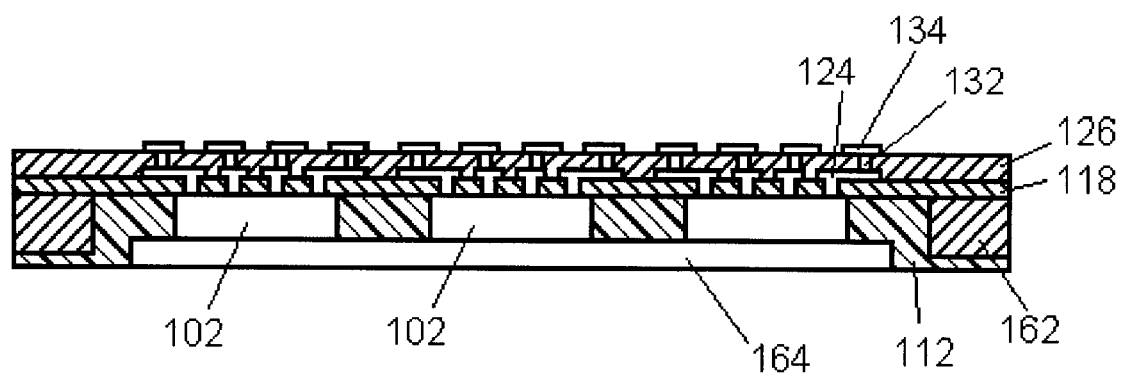

The present invention also includes a methods for die alignment, attachment, and molding. FIGS. 3a–3f illustrate one such method. The active surfaces 106 of a plurality of microelectronic dice 102 are aligned on and attached to the protective film 104, preferably an adhesive backed foil, which extends between a rigid frame 162, preferably a metal frame, as shown in FIG. 3a. The alignment of the plurality of microelectronic dice 102 may be achieved with fiducial marks (not shown) on the protective film 104. As shown in FIG. 3b, a thermally conductive, heat dissipation device, such as heat slug 164, is then attached with a thermally conductive adhesive to the plurality of microelectronic dice 102. The heat slug 164 may be a solid plate or may have a webbed configuration, as shown in top view in FIG. 3c. After attachment of the heat slug 164 to the plurality of microelectronic dice 102, the encapsulation material 112 is molded around the microelectronic dice 102 and the heat slug 164, as shown in FIG. 3d. After encapsulation, as shown in FIG. 3e, the protective film 104 is removed to expose the active surfaces 106 of the plurality of microelectronic dice 102. As illustrated in FIG. 3e, at least one dielectric layer (shown as a first dielectric layer 118 and a second dielectric layer 126), conductive traces 124, and conductive pads 134 are fabricated, such as described in FIGS. 1c–1i. It is, of course, understood that the plurality of microelectronic dice 102 and its associated portion of the heat slug 164 could be singulated either before or after the fabrication of the various dielectric layers, conductive traces, and conductive pads.

Figure 4A:
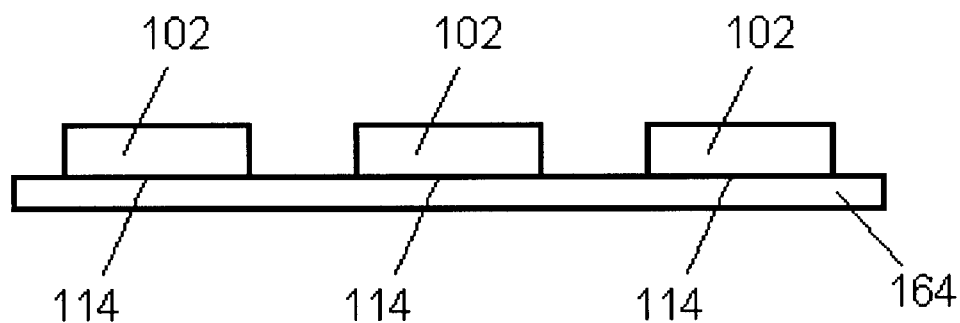
FIGS. 4a–4e are side cross-sectional views of another method for die alignment, attachment, and molding of a microelectronic package, according to the present invention.
Figure 4B:
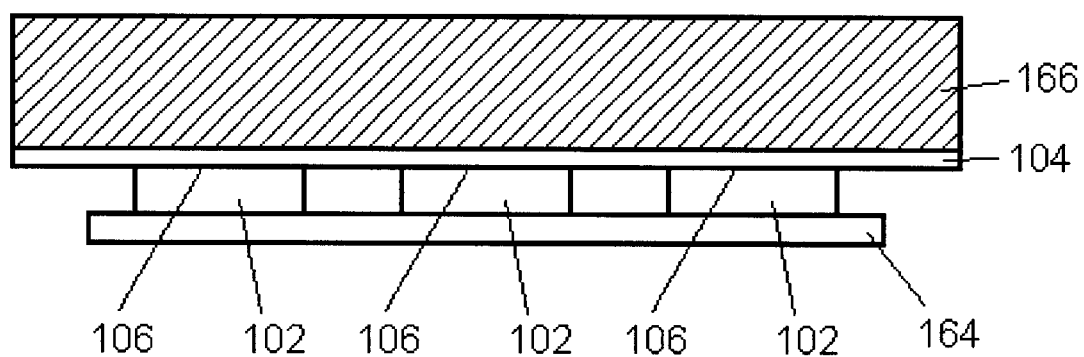
Figure 4C:
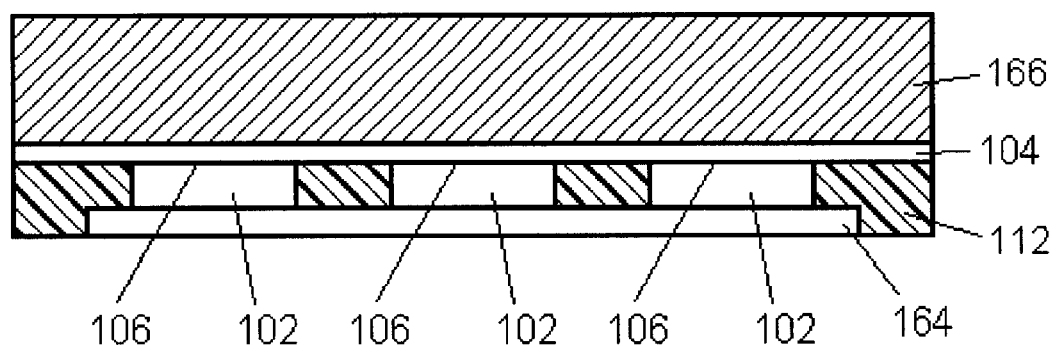
Figure 4D:
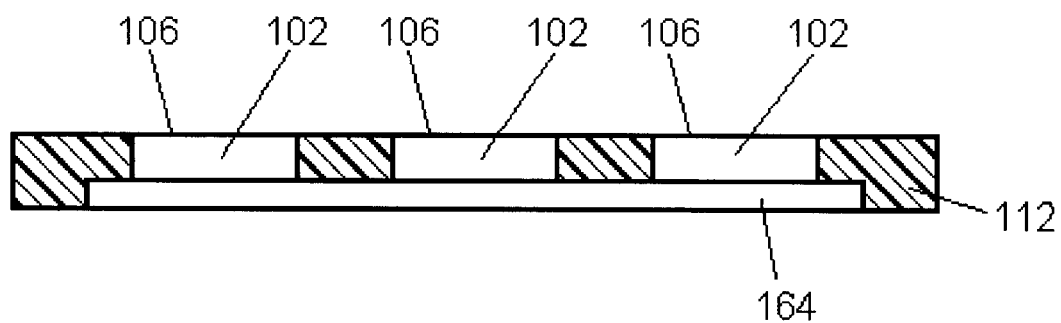
Figure 4E:
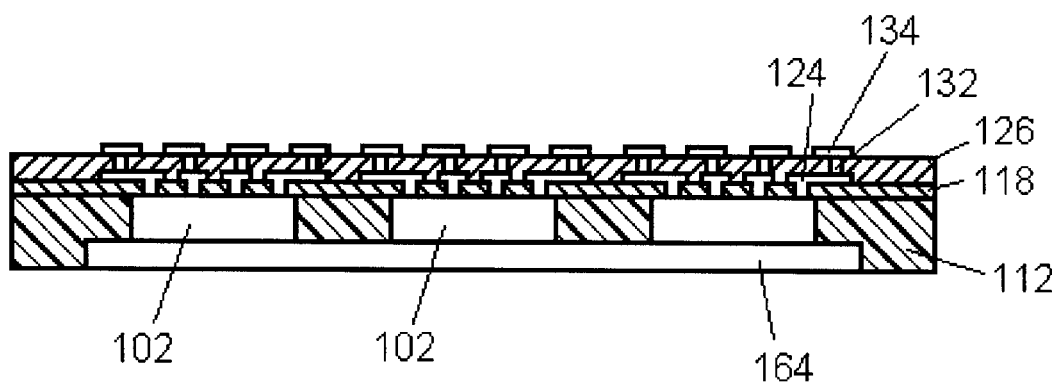

FIGS. 4a–4e illustrate another method for die alignment, attachment, and molding. As shown in FIG. 4a, the back surfaces 114 of a plurality of microelectronic dice 102 are aligned and attached with a thermally conductive adhesive to the heat slug 164. Again, the heat slug 164 may be a solid plate or may have a webbed configuration, as shown in top view in FIG. 3c. The alignment of the plurality of microelectronic dice 102 may be achieved with fiducial marks (not shown) on the heat slug 164. A protective film 104, such as a non-adhesive material, is mounted to a flat plate 166, such as an internal surface of a mold. The protective film 104 is then pressed against the active surfaces 106 of a plurality of microelectronic dice 102, as shown in FIG. 4b. The encapsulation material 112 is molded around the microelectronic dice 102 and the heat slug 164, as shown in FIG. 4c. After encapsulation, as shown in FIG. 4d, the removal of the flat plate 166 also removes the protective film 104 to expose the active surfaces 106 of the plurality of microelectronic dice 102. As illustrated in FIG. 4e, at least one dielectric layer (shown as a first dielectric layer 118 and a second dielectric layer 126), conductive traces 124, and conductive pads 134 are fabricated, such as described in FIGS. 1c–1i. Again, it is understood that the plurality of microelectronic dice 102 and its associated portion of the heat slug 164 could be singulated either before or after the fabrication of the various dielectric layers, conductive traces, and conductive pads.

Figure 5A:
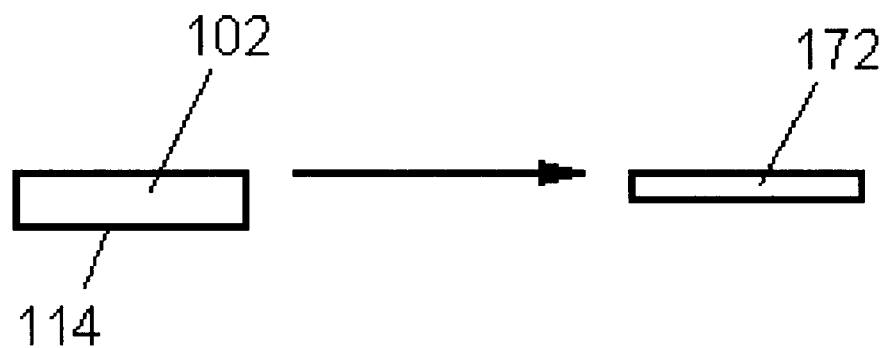
FIGS. 5a–5f are side cross-sectional views of still another method for die alignment, attachment, and molding of a microelectronic package, according to the present invention.
Figure 5B:
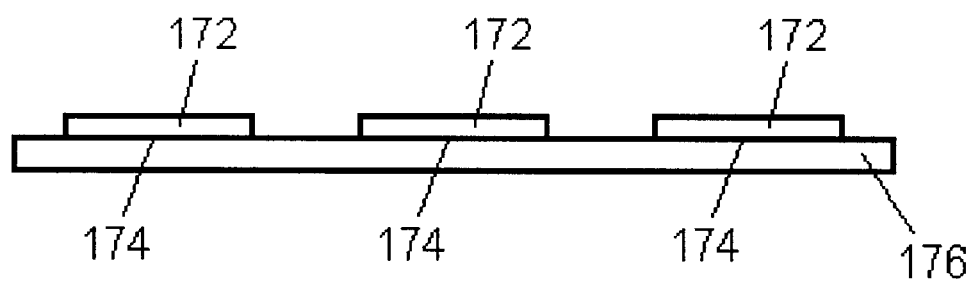
Figure 5C:
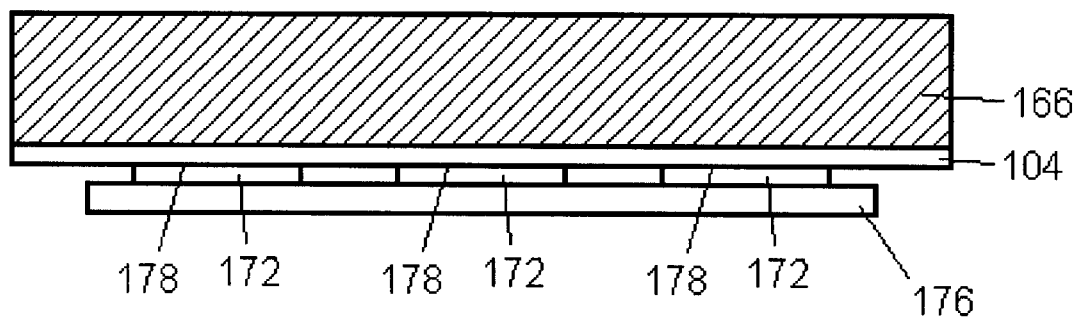
Figure 5D:
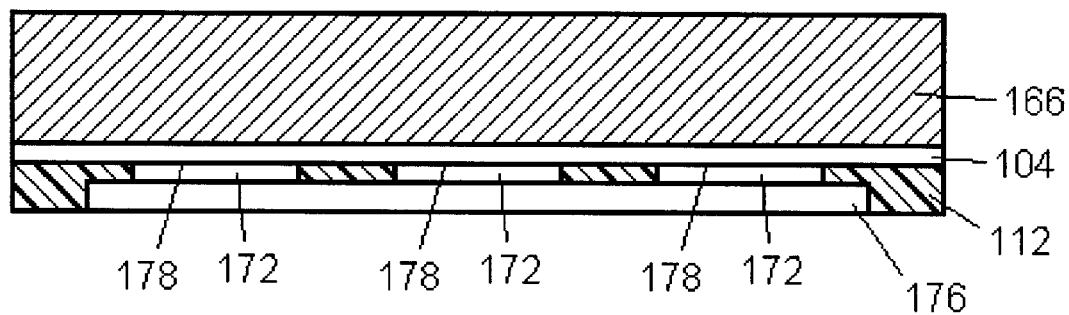
Figure 5E:
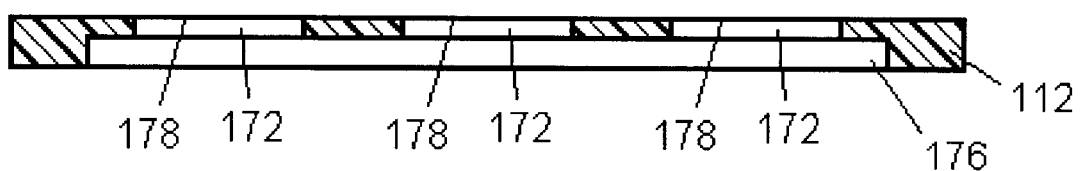
Figure 5F:
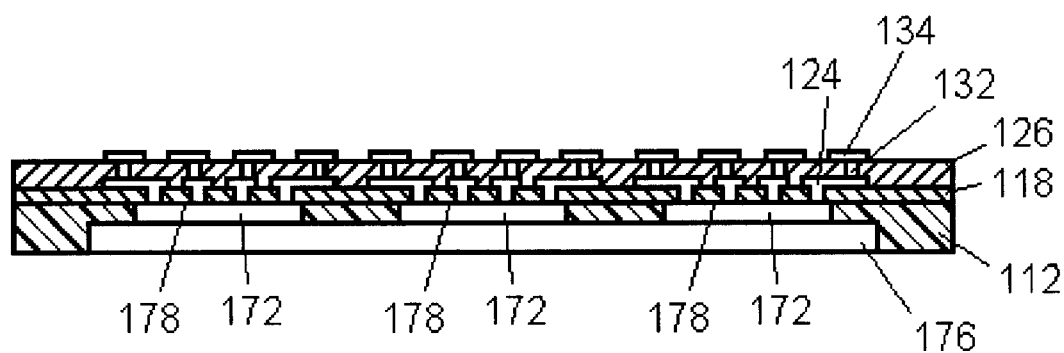

FIGS. 5a–5f illustrate still another method for die alignment, attachment, and molding. As shown in FIG. 5a, the microelectronic die back surface 114 is thinned, such as by grinding, to form a thin microelectronic die 172. The back surfaces 174 of a plurality of thin microelectronic dice 172 are aligned and attached with a thermally conductive adhesive (not shown) to a silicon wafer 176 which acts as heat dissipation device, as shown in FIG. 5b. The alignment of the plurality of thin microelectronic dice 172 may be achieved with fiducial marks (not shown) on the silicon wafer 176. A protective film 104, such as a non-adhesive material, is mounted to a flat plate 166, such as an internal surface of a mold. The protective film 104 is then pressed against the active surfaces 178 of the plurality of microelectronic dice 172, as shown in FIG. 5c. Encapsulation material 112 is molded around the thin microelectronic dice 172 and the silicon wafer 176, as shown in FIG. 5d. After encapsulation, as shown in FIG. 5e, the removal of the flat plate 166 also removes the protective film 104 to expose the active surfaces 178 of the plurality of thin microelectronic dice 172. As illustrated in FIG. 5f, at least one dielectric layer (shown as a first dielectric layer 118 and a second dielectric layer 126), conductive traces 124, and conductive pads 134 are fabricated, such as described in FIGS. 1c–1i. Again, it is understood that the plurality of thin microelectronic dice 172 and its associated portion of the silicon wafer 176 could be singulated either before or after the fabrication of the various dielectric layers, conductive traces, and conductive pads.

Figure 6A:
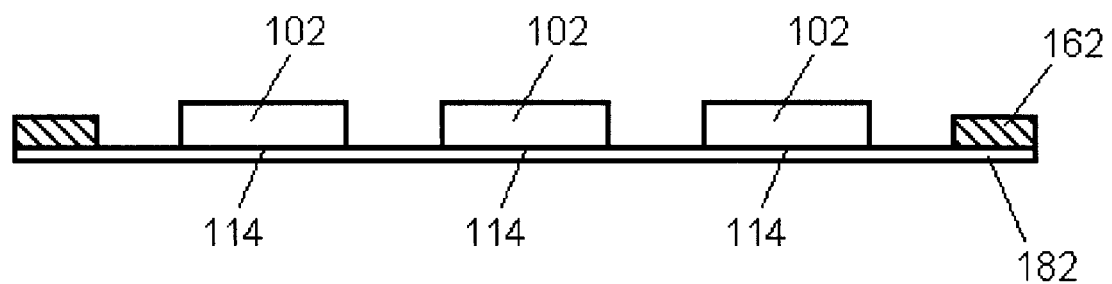
FIGS. 6a–6e are side cross-sectional views of an alternate method for die alignment, attachment, and molding of a microelectronic package, according to the present invention.
Figure 6B:
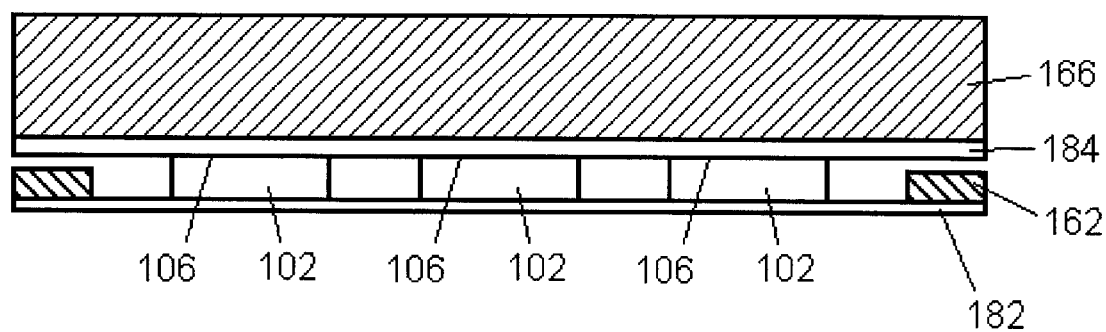
Figure 6C:
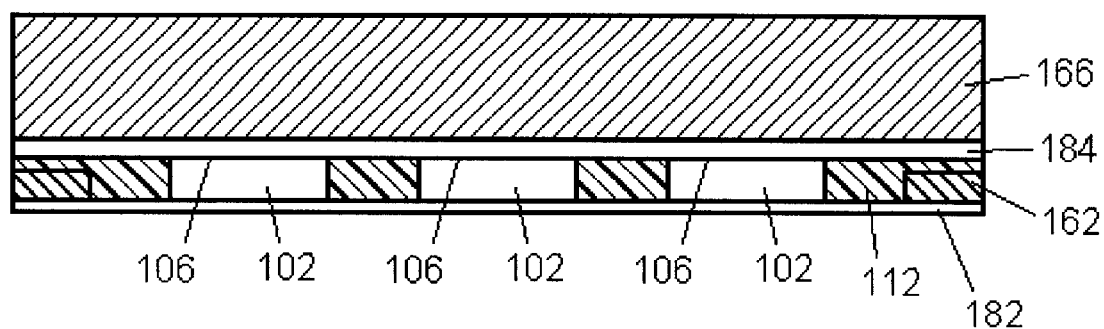
Figure 6D:
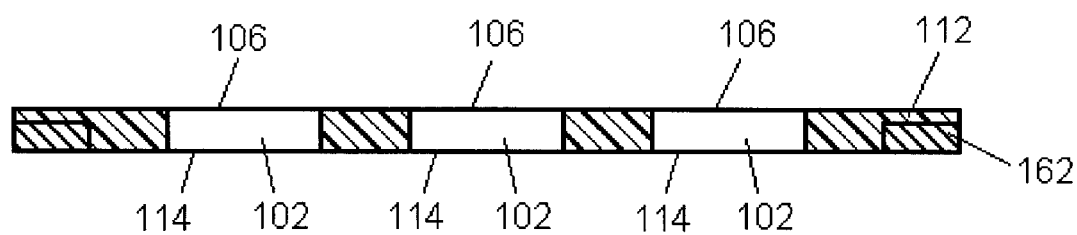
Figure 6E:
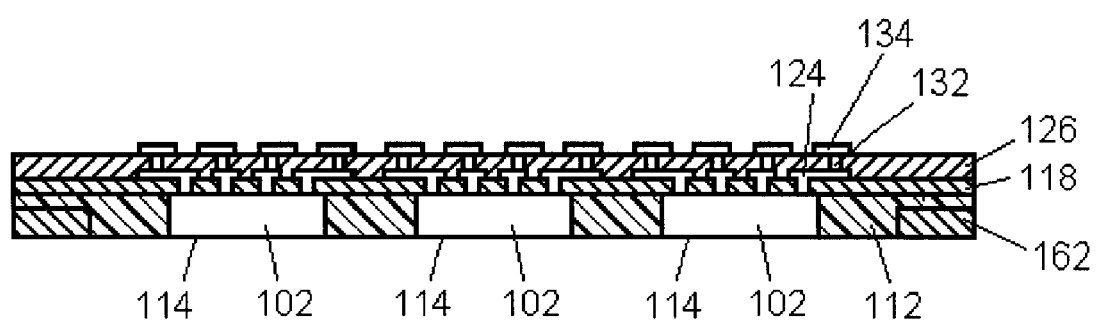

FIGS. 6a–6e illustrate still another method for die alignment, attachment, and molding. As shown in FIG. 6a, the back surfaces 114 of a plurality of microelectronic dice 102 are aligned on and attached to a first protective film 182, preferably an adhesive backed foil, which extends between a rigid frame 162, preferably a metal frame, as shown in FIG. 3a. The alignment of the plurality of microelectronic dice 102 may be achieved with fiducial marks (not shown) on the first protective film 182. A second protective film 184, such as a non-adhesive material, is mounted to a flat plate 166, such as an internal surface of a mold. The second protective film 184 is then pressed against the active surfaces 106 of a plurality of microelectronic dice 102, as shown in FIG. 6b. The encapsulation material 112 is molded around the microelectronic dice 102, as shown in FIG. 6c. After encapsulation, as shown in FIG. 6d, the removal of the flat plate 166 also removes the second protective film 184 to expose the active surfaces 106 of the plurality of microelectronic dice 102. As illustrated in FIG. 6e, at least one dielectric layer (shown as a first dielectric layer 118 and a second dielectric layer 126), conductive traces 124, and conductive pads 134 are fabricated, such as described in FIGS. 1c–1i. Furthermore, as also shown in FIG. 6d, the first protective film 182 is removed to expose the microelectronic die back surfaces 114. The exposed microelectronic die back surfaces 114 may then be attached to heat dissipation devices. Again, it is understood that the plurality of microelectronic dice 102 could be singulated either before or after the fabrication of the various dielectric layers, conductive traces, and conductive pads.

Figure 7A:
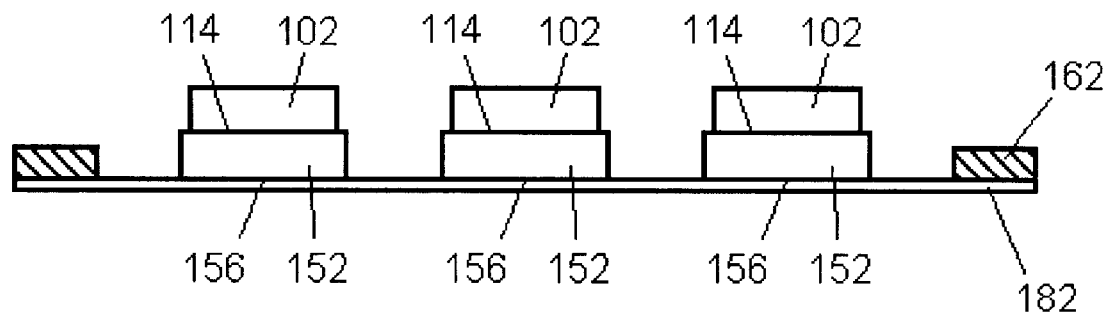
FIGS. 7a–7e are side cross-sectional views of another alternate method for die alignment, attachment, and molding of a microelectronic package, according to the present invention.
Figure 7B:
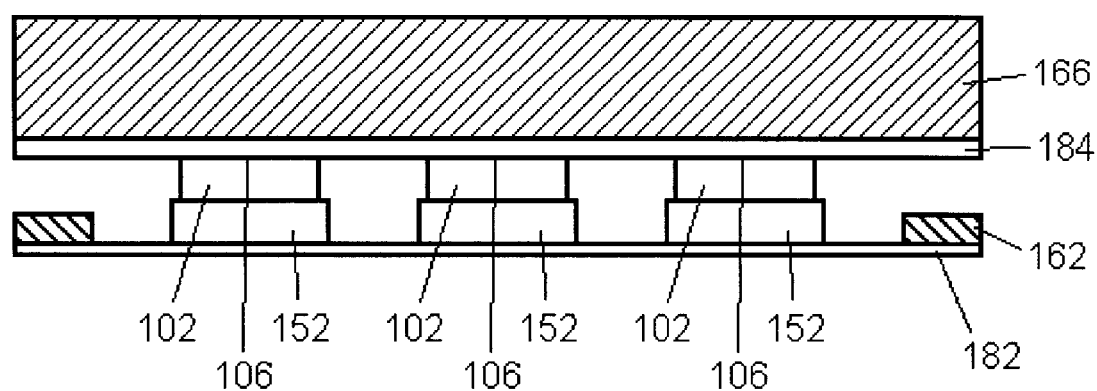
Figure 7C:
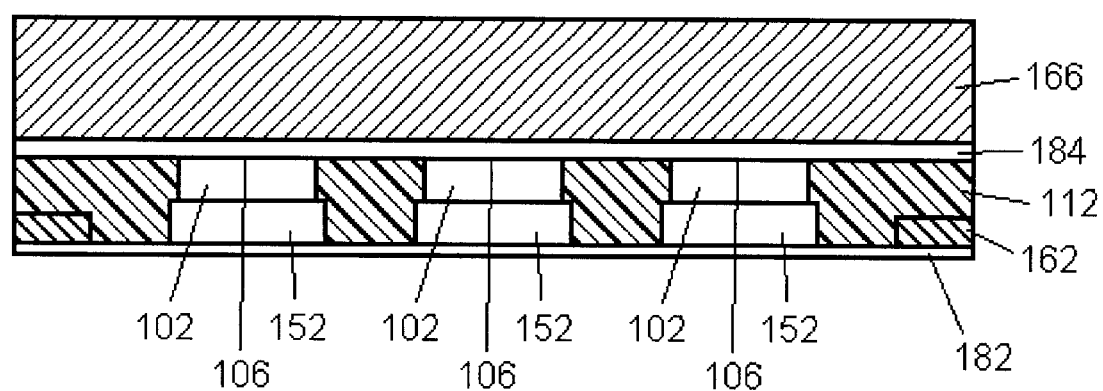
Figure 7D:
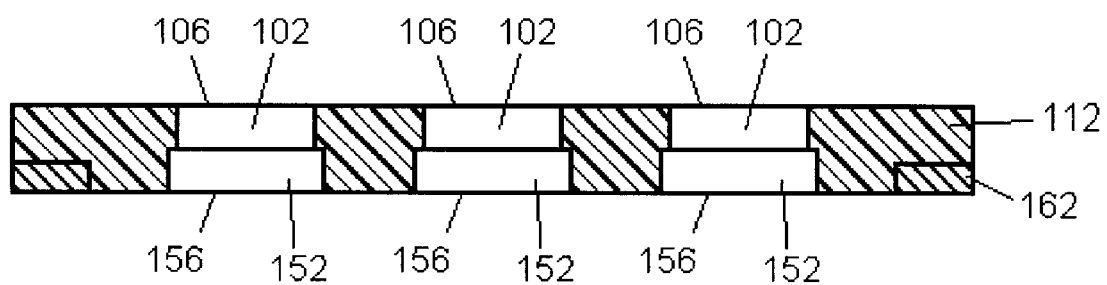
Figure 7E:
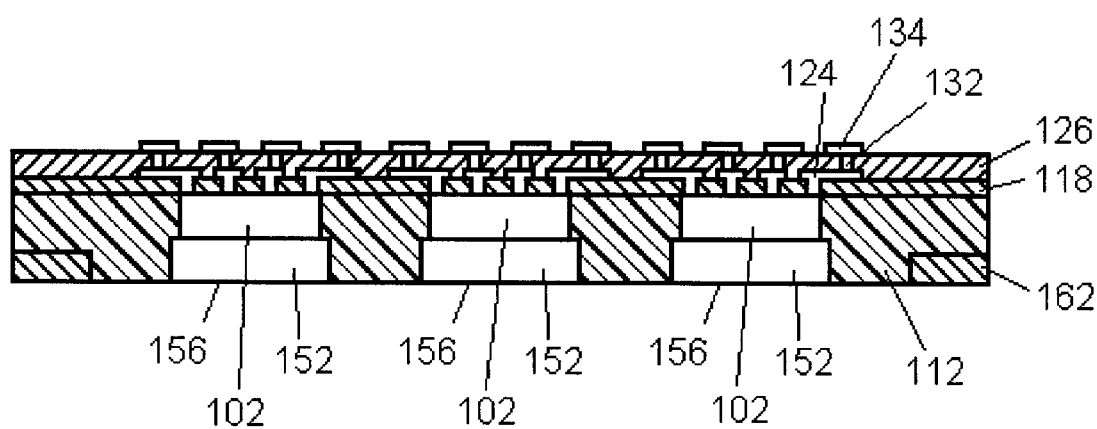
Figure 8:
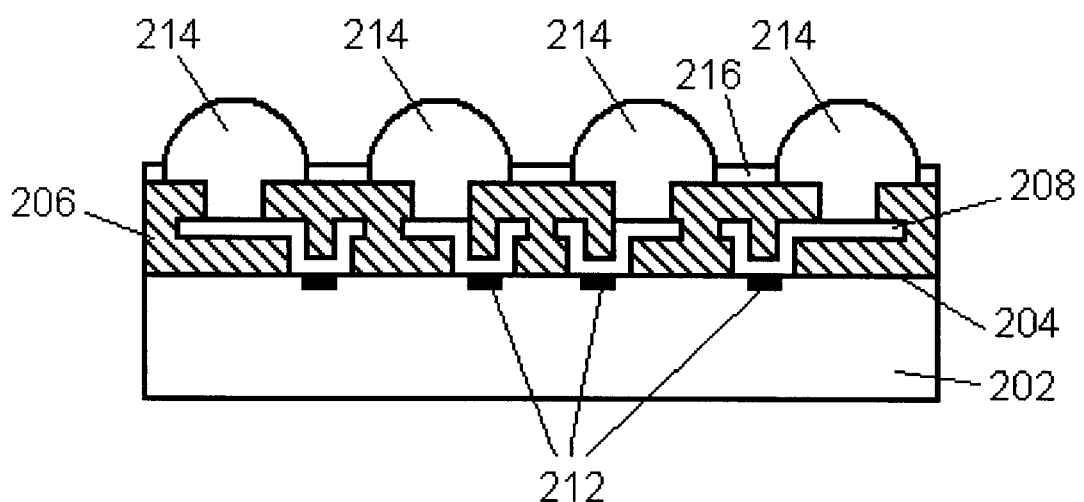
FIG. 8 is a cross-sectional view of a true CSP of a microelectronic device, as known in the art.
Figure 9:
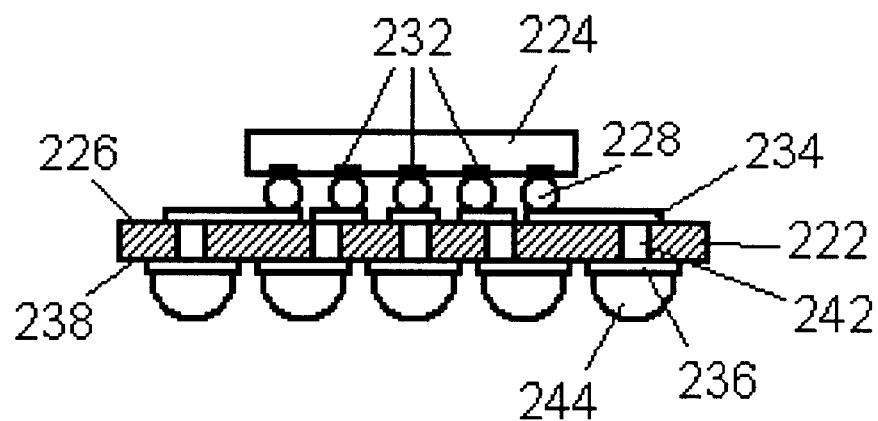
FIG. 9 is a cross-sectional view of a CSP of a microelectronic device utilizing a substrate interposer, as known in the art.
Figure 10:
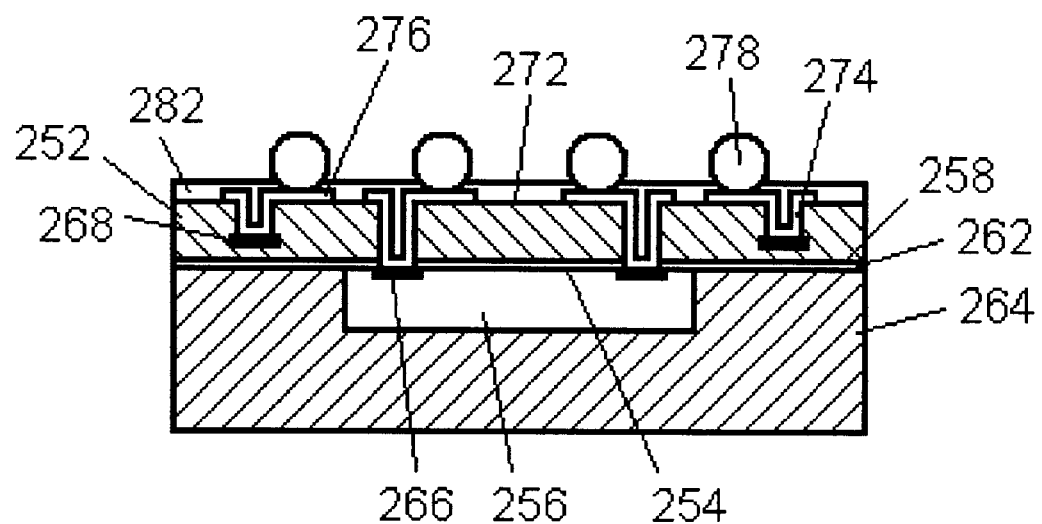
FIG. 10 is a cross-sectional view of a CSP of a microelectronic device utilizing a flex component interposer, as known in the art.

FIGS. 7a–7d illustrate still yet another method for die alignment, attachment, and molding. As shown in FIG. 7a, a plurality of heat slugs 152 is attached to the back surfaces 114 of a plurality of microelectronic dice 102, preferably with a thermally conductive adhesive (not shown). The back surfaces 156 of a plurality of heats slugs 152 are aligned on and attached to a first protective film 182, preferably an adhesive backed foil, which extends between a rigid frame 162, preferably a metal frame. The alignment may be achieved with fiducial marks (not shown) on the first protective film 182. As shown in FIG. 7b, a second protective film 184, such as a non-adhesive material, is mounted to a flat plate 166, such as an internal surface of a mold. The second protective film 184 is then pressed against the active surfaces 106 of a plurality of microelectronic dice 102. The encapsulation material 112 is molded around the microelectronic dice 102, as shown in FIG. 7c. After encapsulation, as shown in FIG. 7d, the first protective film 182 is removed and the removal of the flat plate 166 also removes the second protective film 184 to expose the active surfaces 106 of the plurality of microelectronic dice 102. As illustrated in FIG. 7e, at least one dielectric layer (shown as a first dielectric layer 118 and a second dielectric layer 126), conductive traces 124, and conductive pads 134 are fabricated, such as described in FIG. 1c–1i.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic package, comprising:
   a microelectronic die having an active surface and at least one side;
   encapsulation material adjacent said at least one microelectronic die side, wherein said encapsulation material includes at least one surface substantially planar to said microelectronic die active surface;
   a first dielectric material layer disposed on at least a portion of said microelectronic die active surface and said encapsulation material surface; and
   at least one conductive trace disposed on said first dielectric material layer and in electrical contact with said microelectronic die active surface, wherein said at least one conductive trace extends vertically adjacent said microelectronic die active surface and vertically adjacent said encapsulation material surface.

2. The microelectronic package of claim 1, further including at least one additional dielectric material layer disposed over said at least on conductive trace and said first dielectric material layer.

3. The microelectronic package of claim 2, wherein at least a portion of said at least one conductive trace extends through and resides on said at least one additional dielectric material layer.

4. The microelectronic package of claim 1, wherein said microelectronic die further includes a back surface; and further including at least one heat dissipation device in thermal contact with said microelectronic die back surface.

5. A method of fabricating a microelectronic package, comprising:
   providing at least one microelectronic die having an active surface and at least one side;
   abutting a protective film against said at least one microelectronic die active surface;
   encapsulating said at least one microelectronic die with an encapsulation material adjacent said at least one microelectronic die side, wherein said encapsulating material provides at least one surface of said encapsulation material substantially planar to said microelectronic die active surface; and
   removing said protective film.

6. The method of claim 5, further including:
   forming at least one dielectric material layer on at least a portion of said microelectronic die active surface and said encapsulation material surface;
   forming a via through said at least one dielectric material layer to expose a portion of said microelectronic die active surface; and
   forming at least one conductive trace on said at least one dielectric material layer which extends into said via to electrically contact said microelectronic die active surface, wherein said at least one conductive trace extends vertically adjacent said microelectronic die active surface and vertically adjacent said encapsulation material surface.

7. The method of claim 5, further including forming at least one additional dielectric material layer disposed over said at least on conductive trace and said at least one dielectric material layer.

8. The method of claim 7, wherein forming said at least one conductive trace on said at least one dielectric layer further includes forming at least a portion of said at least one conductive trace to extend through and reside on said at least one additional dielectric material layer.

9. The method of claim 5, further including thermally contacting a heat dissipation device with a back surface of said microelectronic die.

10. A method of fabricating a microelectronic package, comprising:

provining an adhesive protective film suspended on a substantially rigid frame;

attaching an active surface of at least one microelectronic die to said adhesive film;

encapsulating said at least one microelectronic die with an encapsulation material adjacent at least one side of said microelectronic die, wherein said encapsulating material provides at least one surface of said encapsulation material substantially planar to said microelectronic die active surface; and removing said adhesive protective film.

11. The method of claim 10, further including:

forming at least one dielectric material layer on at least a portion of said microelectronic die active surface and said encapsulation material surface;

forming a via through said at least one dielectric material layer to expose a portion of said microelectronic die active surface; and forming at least one conductive trace on said at least one dielectric material layer which extends into said via to electrically contact said microelectronic die active surface, wherein said at least one conductive trace extends vertically adjacent said microelectronic die active surface and vertically adjacent said encapsulation material surface.

12. The method of claim 10, further including forming at least one additional dielectric material layer disposed over said at least on conductive trace and said at least one dielectric material layer.

13. The method of claim 12, wherein forming said at least one conductive trace on said at least one dielectric layer further includes forming at least a portion of said at least one conductive trace to extend through and reside on said at least one additional dielectric material layer.

14. The method of claim 10, further including thermally contacting a heat dissipation device with a back surface of said microelectronic die.

15. A method of fabricating a microelectronic package, comprising:

providing at least one microelectronic die having an active surface, a back surface, and at least one side;

attaching said at least one microelectronic die back surface to a heat dissipation device;

abutting a protective film against said at least one microelectronic die active surface;

encapsulating said at least one microelectronic die and said heat dissipation device with an encapsulation material, wherein said encapsulating material provides at least one surface of said encapsulation material substantially planar to said microelectronic die active surface; and removing said protective film.

16. The method of claim 15, further including:

forming at least one dielectric material layer on at least a portion of said microelectronic die active surface and said encapsulation material surface;

forming a via through said at least one dielectric material layer to expose a portion of said microelectronic die active surface; and forming at least one conductive trace on said at least one dielectric material layer which extends into said via to electrically contact said microelectronic die active surface, wherein said at least one conductive trace extends vertically adjacent said microelectronic die active surface and vertically adjacent said encapsulation material surface.

17. The method of claim 15, further including forming at least one additional dielectric material layer disposed over said at least on conductive trace and said at least one dielectric material layer.

18. The method of claim 17, wherein forming said at least one conductive trace on said at least one dielectric layer further includes forming at least a portion of said at least one conductive trace to extend through and reside on said at least one additional dielectric material layer.

19. The method of claim 15, further including thinning said at least one microelectronic die prior to attaching said at lest one microelectronic die back surface to a heat dissipation device.

20. A method of fabricating a microelectronic package, comprising:

providing an adhesive protective film suspended on a substantially rigid frame;

attaching a back surface of at least one microelectronic die to said adhesive film;

abutting a protective film against an active surface of said at least one microelectronic die;

encapsulating said at least one microelectronic die with an encapsulation material adjacent at least one side of said microelectronic die, wherein said encapsulating material provides at least one surface of said encapsulation material substantially planar to said microelectronic die active surface;

removing said protective film; and removing said adhesive protective film.

21. A method of fabricating a microelectronic package, comprising:

providing an adhesive protective film suspended on a substantially rigid frame;

attaching a back surface of at least one microelectronic die to at least one heat dissipation device;

attaching a back surface of said at least one heat dissipation device to said adhesive film;

abutting a protective film against an active surface of said at least one microelectronic die;

encapsulating said at least one microelectronic die with an encapsulation material adjacent at least one side of said microelectronic die, wherein said encapsulating material provides at least one surface of said encapsulation material substantially planar to said microelectronic die active surface;

removing said protective film; and removing said adhesive protective film.

* * * * *

UNITED STATES PATENT AND TRADEMARK OFFICE
CERTIFICATE OF CORRECTION

PATENT NO.        : 6,271,469 B1                                          Page 1 of 1
APPLICATION NO.   : 09/438221
DATED             : August 7, 2001
INVENTOR(S)       : Qing Ma, Xiao-Chun Mu and Harry Fujimoto It is certified that error appears in the above-identified patent and that said Letters Patent is hereby corrected as shown below:

On the Title page (75)
The following inventor's name is spelled incorrectly:

Listed as:    Chun Mu

Should be:    Xiao-Chun Mu

Signed and Sealed this

Fifth Day of December, 2006

JON W. DUDAS
*Director of the United States Patent and Trademark Office*